United States Patent
Yasuda

(10) Patent No.: US 11,581,912 B2
(45) Date of Patent: Feb. 14, 2023

(54) FRONT-END CIRCUIT AND COMMUNICATION DEVICE

(71) Applicant: Murata Manufacturing Co., Ltd., Nagaokakyo (JP)

(72) Inventor: Junpei Yasuda, Nagaokakyo (JP)

(73) Assignee: MURATA MANUFACTURING CO., LTD., Kyoto (JP)

(\*) Notice: Subject to any disclaimer, the term of this patent is extended or adjusted under 35 U.S.C. 154(b) by 0 days.

(21) Appl. No.: 17/322,986

(22) Filed: May 18, 2021

(65) Prior Publication Data
US 2021/0273670 A1    Sep. 2, 2021

Related U.S. Application Data

(63) Continuation of application No. PCT/JP2019/047264, filed on Dec. 3, 2019.

(30) Foreign Application Priority Data

Dec. 4, 2018  (JP) .............................. JP2018-227207

(51) Int. Cl.
| | |
|---|---|
| H04B 1/16 | (2006.01) |
| H04B 1/00 | (2006.01) |
| H04B 1/04 | (2006.01) |
| H04B 1/44 | (2006.01) |

(52) U.S. Cl.
CPC ............ H04B 1/1615 (2013.01); H04B 1/006 (2013.01); H04B 1/0483 (2013.01); H04B 1/44 (2013.01)

(58) Field of Classification Search
CPC .... H04B 1/0053; H04B 1/0057; H04B 1/006; H04B 1/0067; H04B 1/0483; H04B 1/1615; H04B 1/44; H04B 1/48; H04B 1/50; H04B 2001/0408; H04L 5/06; H04L 5/22

USPC ............... 375/219, 222, 267, 297, 299, 349; 370/278, 280–282, 294, 295, 334; 455/78, 82–84, 101, 114.3

See application file for complete search history.

(56) References Cited

U.S. PATENT DOCUMENTS

| | | |
|---|---|---|
| 6,535,748 B1 | 3/2003 | Vuorio et al. |
| 2007/0021080 A1 | 1/2007 | Kuriyama et al. |
| 2010/0202325 A1 | 8/2010 | Poulin et al. |

(Continued)

FOREIGN PATENT DOCUMENTS

| | | |
|---|---|---|
| JP | 2000-031861 A | 1/2000 |
| JP | 2007-019939 A | 1/2007 |
| WO | 2017/006866 A1 | 1/2017 |

OTHER PUBLICATIONS

Official Communication issued in International Patent Application No. PCT/JP2019/047264, dated Jan. 7, 2020.

*Primary Examiner* — Young T. Tse
(74) *Attorney, Agent, or Firm* — Keating & Bennett, LLP

(57) ABSTRACT

A front-end circuit includes an antenna connection terminal, a selection terminal, and a selection terminal, a switching circuit including a common terminal and selection terminals, a receive filter configured to pass a radio-frequency signal in Band B, a signal path connecting the selection terminal and the selection terminal and including the receive filter, a signal path connecting the selection terminal and the selection terminal and defining and functioning as a bypass path without any filter, and a filter coupled between the antenna connection terminal and the common terminal and configured to pass a first frequency range group including Band B.

19 Claims, 9 Drawing Sheets

(56) References Cited

U.S. PATENT DOCUMENTS

| | | |
|---|---|---|
| 2012/0171968 A1 | 7/2012 | Poulin et al. |
| 2013/0188529 A1 | 7/2013 | Poulin et al. |
| 2015/0133067 A1* | 5/2015 | Chang .................... H04B 1/006 |
| | | 455/78 |
| 2017/0294947 A1* | 10/2017 | Little .................... H04B 1/0064 |
| 2018/0019768 A1* | 1/2018 | King .................... H04L 27/0002 |
| 2018/0048345 A1 | 2/2018 | Pehlke et al. |
| 2018/0123620 A1 | 5/2018 | Ueno |
| 2018/0131501 A1* | 5/2018 | Little .................... H04B 1/0064 |
| 2018/0254794 A1 | 9/2018 | Lee et al. |
| 2019/0013836 A1 | 1/2019 | Pehlke et al. |
| 2019/0158137 A1* | 5/2019 | Brunel .................... H04B 1/005 |

* cited by examiner

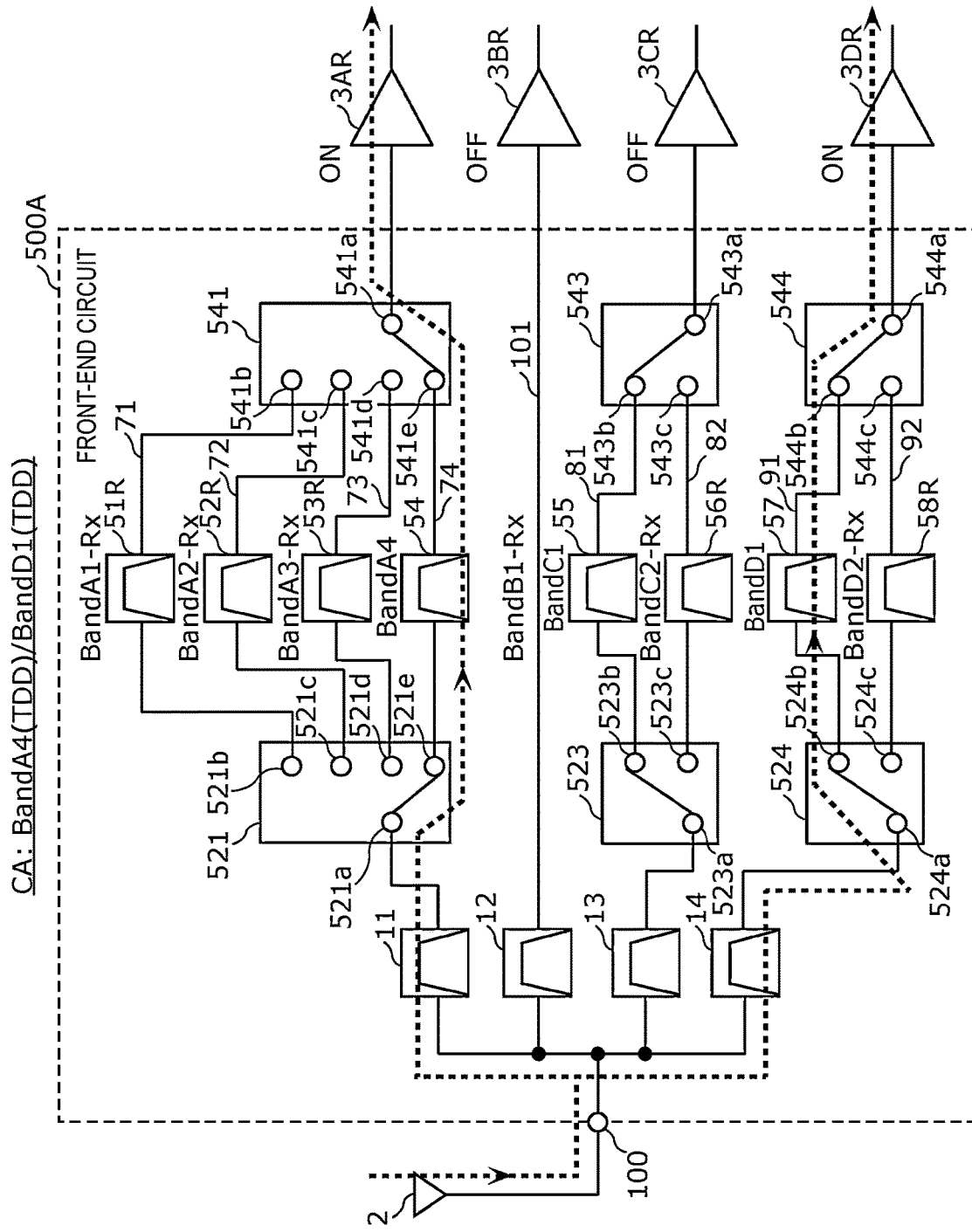

FRONT-END CIRCUIT AND COMMUNICATION DEVICE

CROSS REFERENCE TO RELATED APPLICATIONS

This application claims the benefit of priority to Japanese Patent Application No. 2018-227207 filed on Dec. 4, 2018 and is a Continuation Application of PCT Application No. PCT/JP2019/047264 filed on Dec. 3, 2019. The entire contents of each application are hereby incorporated herein by reference.

BACKGROUND OF THE INVENTION

1. Field of the Invention

The present invention relates to a front-end circuit and a communication device.

2. Description of the Related Art

In recent years, mobile phones have been required to support multiple frequency ranges and radio systems with a single terminal (multiband and multimode operations). Front-end circuits supporting multiband and multimode operations in increasing cases use carrier aggregation (CA), which is a technology of simultaneously using transmit or receive signals in different communication bands. This requires high-speed processing of multiple transmit/receive signals without quality degradation.

International Publication No. 2017/006866 discloses a circuit configuration of a front-end module capable of achieving excellent isolation characteristics among multiple communication bands in CA. More specifically, the front-end module includes an antenna switch module for selectively connecting an antenna element to one of a plurality of signal paths, a first circuit coupled to a Long Term Evolution (LTE) Band 8 signal path including a duplexer, and a second circuit coupled to an LTE Band 3 signal path including a duplexer and coupled to the first circuit via an electromagnetic field. With the configuration described above, controlling the level of electromagnetic field coupling between the first circuit and the second circuit can easily control the amplitude and phase of a signal propagating between a first signal path and a second signal path, and as a result, excellent isolation characteristics among multiple communication bands can be achieved in CA.

The front-end module disclosed in International Publication No. 2017/006866 can switch the signal paths in accordance with the communication system, such as a frequency division duplex (FDD) or time division duplex (TDD) system. However, radio-frequency signals in the different communication bands propagating in the front-end module need to pass through both the antenna switch module and corresponding filters because the signal paths include the filters having pass bands corresponding to the respective communication bands. As a result, a problem arises in which the filter insertion loss increases the radio-frequency signal propagation loss in any communication system.

SUMMARY OF THE INVENTION

Preferred embodiments of the present invention provide front-end circuits and communication devices that are each able to reduce the radio-frequency signal propagation loss in a system capable of communicating radio-frequency signals while switching a plurality of communication systems.

A front-end circuit according to a preferred embodiment of the present invention is provided to communicate a radio-frequency signal. The front-end circuit includes a first input-output terminal, a second input-output terminal, and a third input-output terminal to input a radio-frequency signal to the front-end circuit or output a radio-frequency signal from the front-end circuit, a first switching circuit including a first common terminal coupled to the first input-output terminal, the first switching circuit also including a first selection terminal and a second selection terminal, the first switching circuit being configured to exclusively connect the first common terminal to the first selection terminal or to the second selection terminal, a first filter configured to pass a radio-frequency signal in a first communication band, a first signal path connecting the first selection terminal and the second input-output terminal, the first filter being located in the first signal path, the first signal path being configured to communicate the radio-frequency signal in the first communication band, and a second signal path connecting the second selection terminal and the third input-output terminal, the second signal path defining and functioning as a bypass path without any filter, the second signal path being configured to communicate the radio-frequency signal in the first communication band. The front-end circuit is configured to exclusively switch between communication of the radio-frequency signal in the first communication band from the first input-output terminal to the second input-output terminal through the first signal path and communication of the radio-frequency signal in the first communication band from the first input-output terminal to the third input-output terminal through the second signal path or between communication of the radio-frequency signal in the first communication band from the second input-output terminal to the first input-output terminal through the first signal path and communication of the radio-frequency signal in the first communication band from the third input-output terminal to the first input-output terminal through the second signal path.

A front-end circuit according to a preferred embodiment of the present invention is provided to communicate a radio-frequency signal. The front-end circuit includes a first input-output terminal, a second input-output terminal, and a third input-output terminal to input a radio-frequency signal to the front-end circuit or output a radio-frequency signal from the front-end circuit, a first switching circuit including a first common terminal, a first selection terminal, and a second selection terminal, the first switching circuit being configured to exclusively connect the first common terminal to the first selection terminal or to the second selection terminal, a first filter configured to pass a radio-frequency signal in a first communication band, a first signal path connecting the first selection terminal and the second input-output terminal, the first filter being disposed in the first signal path, the first signal path being configured to communicate the radio-frequency signal in the first communication band, a second signal path connecting the second selection terminal and the third input-output terminal, the second signal path defining and functioning as a bypass path without any filter, the second signal path being configured to communicate the radio-frequency signal in the first communication band, and a second filter coupled between the first input-output terminal and the first common terminal, the second filter being configured to pass a first frequency range group including the first communication band.

Preferred embodiments of the present invention provide front-end circuits and communication devices that are each able to reduce the radio-frequency signal propagation loss in a system capable of communicating radio-frequency signals while switching a plurality of communication systems.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6 illustrates a front-end circuit according to a second comparative example in the TDD-only mode.

DETAILED DESCRIPTION OF THE PREFERRED EMBODIMENTS

Figure 1A:
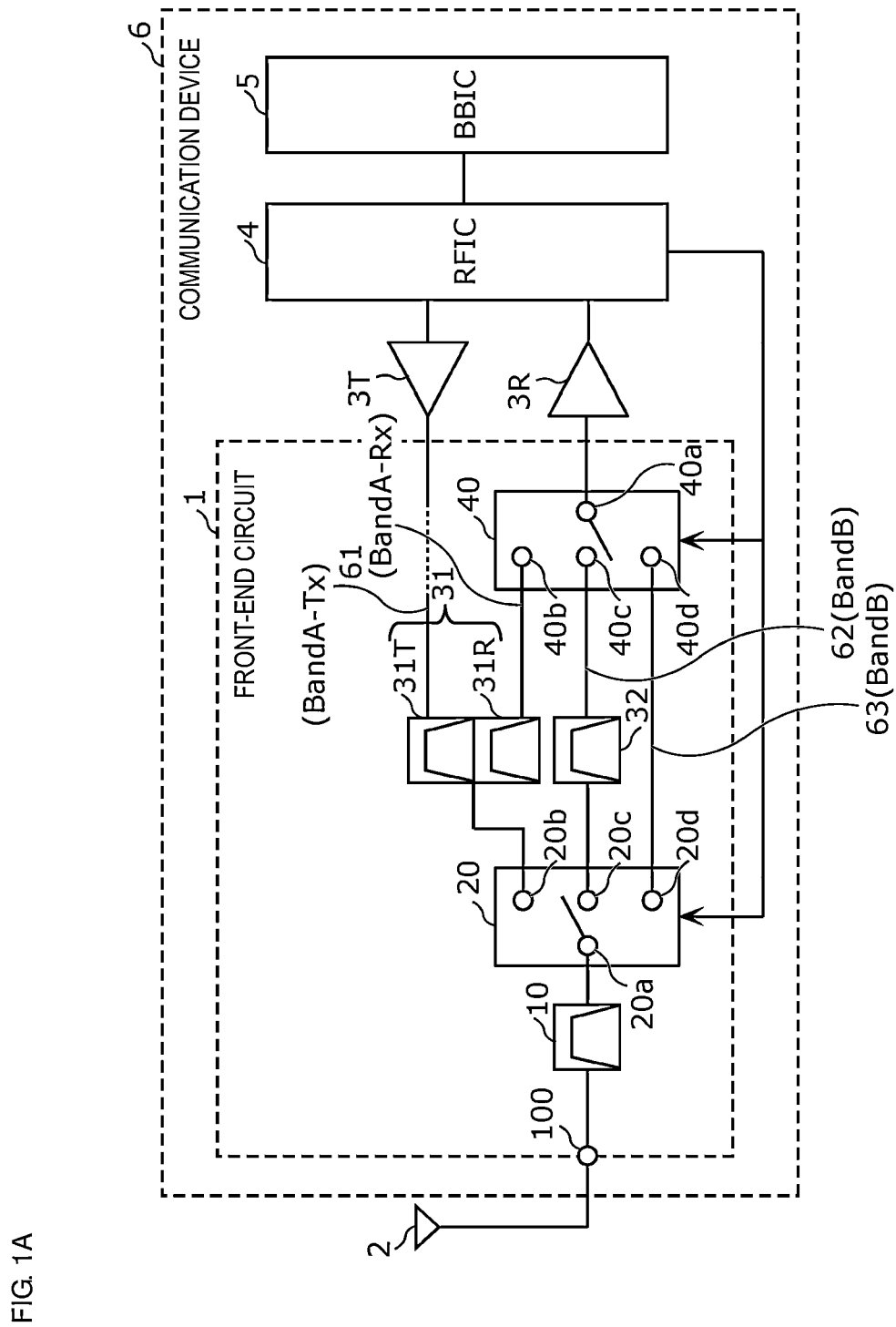
FIG. 1A is a circuit configuration diagram of a front-end circuit and a communication device according to a first preferred embodiment of the present invention.

Hereinafter, preferred embodiments of the present invention will be described in detail with reference to the drawings. It should be noted that the preferred embodiments described below are all specific or comprehensive examples. Specifics including numerical values, shapes, materials, elements, arrangements of the elements, and modes of connection described in the following preferred embodiments are mere examples and are not intended to limit the present invention. Among the elements in the following preferred embodiments, elements not recited in any of the independent claims are described as arbitrary elements. Furthermore, the size or the size ratio of the elements illustrated in the drawings is not necessarily presented in an exact manner.

First Preferred Embodiment 1.1 Circuit Configuration of Front-End Circuit and Communication Device FIG. 1A is a circuit configuration diagram of a front-end circuit 1 and a communication device 6 according to a first preferred embodiment of the present invention. FIG. 1A also illustrates an antenna 2 coupled to the communication device 6. The communication device 6 includes the front-end circuit 1, a transmit amplifier 3T, a receive amplifier 3R, a radio-frequency integrated circuit (RFIC) 4, and a baseband integrated circuit (BBIC) 5.

The RFIC 4 processes a radio-frequency receive signal inputted from the antenna 2 via the front-end circuit 1 and the receive amplifier 3R by performing, for example, down-conversion and outputs the processed receive signal generated by the signal processing to the BBIC 5. The RFIC 4 also processes a transmit signal inputted from the BBIC 5 by performing, for example, up-conversion and outputs a high-frequency transmit signal generated by the signal processing toward the transmit amplifier 3T and the front-end circuit 1.

The signal processed by the BBIC 5 is used as, for example, an image signal to display images or a sound signal for calls. The RFIC 4 and the BBIC 5 are preferably, for example, integrated circuits (ICs).

The transmit amplifier 3T is an amplifier circuit configured to exclusively amplify radio-frequency transmit signals in Band A. The transmit amplifier 3T is preferably, for example, a power amplifier (power amplifying device). The receive amplifier 3R is an amplifier circuit coupled to a common terminal 40a of a switching circuit 40 and configured to exclusively amplify radio-frequency receive signals in Bands A and B. The receive amplifier 3R is preferably, for example, a low-noise amplifier (low-noise amplifying device).

The front-end circuit 1 is a multi-carrier transceiver device including a plurality of signal paths to transmit and receive radio signals in a plurality of communication bands (frequency ranges) for the purpose of supporting multiple modes/multiple bands. The front-end circuit 1 includes switching circuits 20 and 40, signal paths 61, 62, and 63, a duplexer 31, a receive filter 32, a filter 10, and an antenna connection terminal 100. The front-end circuit 1 is provided at a front-end of, for example, a multimode/multiband mobile phone.

The switching circuit 20 is a first switching circuit including a common terminal 20a (first common terminal), a selection terminal 20b (fifth selection terminal), a selection terminal 20c (first selection terminal), and a selection terminal 20d (second selection terminal) and configured to exclusively connect the common terminal 20a to the selection terminal 20c or 20d.

The common terminal 20a is coupled to the antenna connection terminal 100 (first input-output terminal) via the filter 10. The selection terminal 20b is coupled to the signal path 61, the selection terminal 20c is coupled to the signal path 62, and the selection terminal 20d is coupled to the signal path 63.

The switching circuit 40 is a second switching circuit including the common terminal 40a (second common terminal), a selection terminal 40b, a selection terminal 40c (third selection terminal), and a selection terminal 40d (fourth selection terminal) and configured to exclusively connect the common terminal 40a to the selection terminal 40c or 40d. The selection terminal 40b corresponds to a fourth input-output terminal to output radio-frequency signals in Band A from the front-end circuit 1. The selection terminal 40*c* corresponds to a second input-output terminal to output radio-frequency signals in Band B from the front-end circuit 1. The selection terminal 40*d* corresponds to a third input-output terminal to output radio-frequency signals in Band B from the front-end circuit 1.

The common terminal 40*a* is coupled to the receive amplifier 3R and configured to output a radio-frequency signal from the front-end circuit 1 to the receive amplifier 3R.

The selection terminal 40*b* is coupled to the signal path 61, the selection terminal 40*c* is coupled to the signal path 62, and the selection terminal 40*d* is coupled to the signal path 63.

The signal path 61 is a third signal path that is used to transfer radio-frequency receive signals in Band A (second communication band) and that connects the selection terminal 20*b* and the selection terminal 40*b*. The signal path 62 is a first signal path that is used to transfer radio-frequency receive signals in Band B (first communication band) and that connects the selection terminal 20*c* and the selection terminal 40*c*. The signal path 63 is a second signal path that is used to transfer radio-frequency receive signals in Band B (first communication band) and that connects the selection terminal 20*d* and the selection terminal 40*d*.

The duplexer 31 is a filter device including a transmit filter 31T and a receive filter 31R and configured to transmit and receive radio-frequency signals in Band A in accordance with a frequency division duplex (FDD) system. The output end of the transmit filter 31T and the input end of the receive filter 31R are coupled to the selection terminal 20*b* by the signal path 61. The input end of the transmit filter 31T is coupled to the transmit amplifier 3T. The output end of the receive filter 31R is coupled to the selection terminal 40*b* by the signal path 61. The receive filter 31R is a third filter provided in the signal path 61.

The receive filter 32 is a first filter provided in the signal path 62 and configured to pass radio-frequency signals in Band B (first communication band). The receive filter 32 is a filter configured to receive radio-frequency signals in Band B (first communication band) in accordance with a time division duplex (TDD) system.

The signal path 63 is a bypass path without any filter.

The signal paths 62 and 63 are used to transfer radio-frequency signals in Band B in the TDD system.

The filter 10 is a second filter coupled between the antenna connection terminal 100 and the common terminal 20*a* and configured to pass a first frequency range group including Bands B and A.

The transmit filter 31T, the receive filters 31R and 32, and the filter 10 may be surface acoustic wave filters or bulk acoustic wave (BAW) filters, for example. The transmit filter 31T, the receive filters 31R and 32, and the filter 10 are not necessarily acoustic wave filters but may be LC filters or dielectric filters, for example, in other words, filters configured in any suitable manner.

The front-end circuit 1 having the configuration described above exclusively switches between communication of radio-frequency receive signals in Band B from the antenna connection terminal 100 to the selection terminal 40*c* through the signal path 62 and communication of radio-frequency receive signals in Band B from the antenna connection terminal 100 to the selection terminal 40*d* through the signal path 63.

For example, Long Term Evolution (LTE) Band 39 (frequency range: about 1880 MHz-about 1920 MHz), Band 41 (frequency range: about 2496 MHz-about 2690 MHz), Band 40 (frequency range: about 2300 MHz-about 2400 MHz), or Band 34 (frequency range: about 2010 MHz-about 2025 MHz), which are applicable to the TDD system, can be used as Band B (first communication band).

When Band B (first communication band) is LTE Band 39 (frequency range: about 1880 MHz-about 1920 MHz), the filter 10 is a band pass filter of a pass band corresponding to, for example, a middle-low band (MLB: about 1475.9 MHz-about 2025 MHz) (or low pass filter). Alternatively, when Band B (first communication band) is LTE Band 41 (frequency range: about 2496 MHz-about 2690 MHz), the filter 10 is a band pass filter of a pass band corresponding to, for example, a high band (HB: about 2496 MHz-about 2690 MHz) (or high pass filter). Alternatively, when Band B (first communication band) is LTE Band 40 (frequency range: about 2300 MHz-about 2400 MHz), the filter 10 is a band pass filter of a pass band corresponding to, for example, a middle-high band (MHB: about 2300 MHz-about 2400 MHz).

Band B (first communication band) may be a communication band applicable to a supplemental downlink (SDL) system such as, for example, LTE Band 32 (frequency range: about 1452 MHz-about 1496 MHz). In this case, the signal paths 62 and 63 are used to transfer radio-frequency signals in the SDL system.

Alternatively, Band B (first communication band) may be a Global Positioning System (GPS) (registered trademark) band or a Wi-Fi (registered trademark) band, for example. In this case, the receive filter 32 is a filter of a pass band corresponding to the GPS (registered trademark) band or Wi-Fi (registered trademark) band, and the transmit filter 31T and the receive filter 31R are filters of a pass band corresponding to an LTE band. This configuration enables the front-end circuit 1 to be used in a system supporting a plurality of communication systems.

Alternatively, Band B (first communication band) may be a communication band included in a cellular band (about 1.5 GHz-about 2.7 GHz). Examples of the communication band included in the cellular band include LTE Band 39, Band 41, Band 40, and Band 34. Band A (second communication band), which can be received simultaneously with Band B (first communication band), may be the 2.4 GHz Wi-Fi band.

Figure 1B:
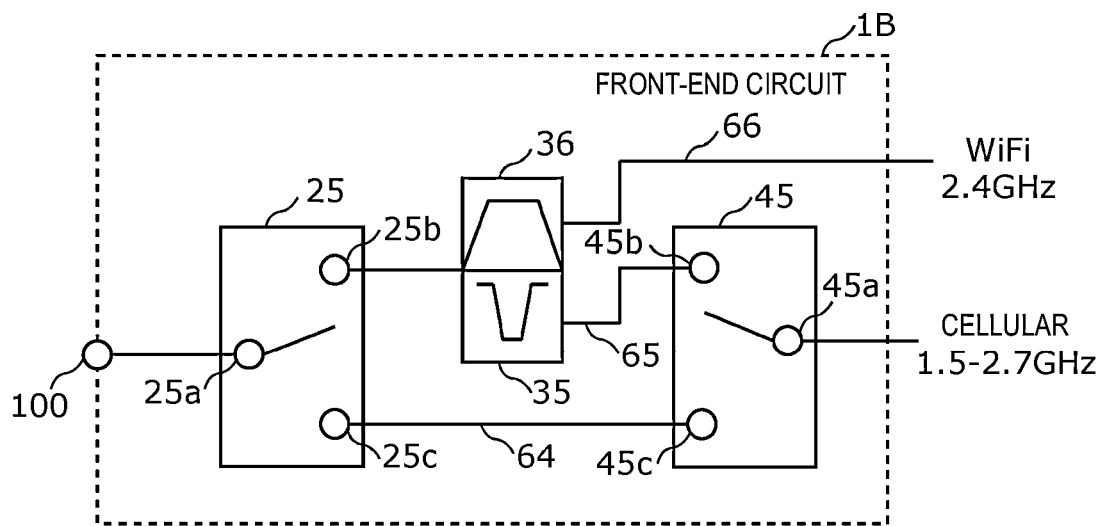
FIG. 1B is a circuit configuration diagram of a front-end circuit according to a first modification of the first preferred embodiment of the present invention.

FIG. 1B is a circuit configuration diagram of a front-end circuit 1B according to a first modification of the first preferred embodiment. The front-end circuit 1B illustrated in FIG. 1B is a modification to the front-end circuit 1 according to the first preferred embodiment. The front-end circuit 1B according to this modification includes switching circuits 25 and 45, signal paths 64, 65, and 66, a band rejection filter 35, a filter 36, and the antenna connection terminal 100.

The switching circuit 25 is a first switching circuit including the common terminal 25*a* (first common terminal), a selection terminal 25*b* (first selection terminal), and a selection terminal 25*c* (second selection terminal) and configured to exclusively connect the common terminal 25*a* to the selection terminal 25*b* or 25*c*.

The common terminal 25*a* is coupled to the antenna connection terminal 100 (first input-output terminal). The selection terminal 25*b* is coupled to the signal paths 65 and 66, and the selection terminal 25*c* is coupled to the signal path 64.

The switching circuit 45 is a second switching circuit including a common terminal 45*a* (second common terminal), a selection terminal 45*b* (third selection terminal), and a selection terminal 45*c* (fourth selection terminal) and configured to exclusively connect the common terminal 45*a* to the selection terminal 45*b* or 45*c*. The selection terminal

45*b* corresponds to a second input-output terminal to output radio-frequency signals in Band B from the front-end circuit 1B. The selection terminal 45*c* corresponds to a third input-output terminal to output radio-frequency signals in Band B from the front-end circuit 1B.

The common terminal 45*a* is coupled to the receive amplifier 3R and configured to output a radio-frequency signal from the front-end circuit 1B to the receive amplifier 3R.

The selection terminal 45*b* is coupled to the signal path 65, and the selection terminal 45*c* is coupled to the signal path 64.

The signal path 66 is used to transfer radio-frequency receive signals in Band A (second communication band). The signal path 65 is a first signal path that is used to transfer radio-frequency receive signals in Band B (first communication band) and that connects the selection terminal 25*b* and the selection terminal 45*b*. The signal path 64 is a second signal path that is used to transfer radio-frequency receive signals in Band B (first communication band) and that connects the selection terminal 25*c* and the selection terminal 45*c*.

The filter 36 is a filter device provided in the signal path 66 and configured to receive radio-frequency signals in Band A. The input end of the filter 36 is coupled to the selection terminal 25*b*, while the output end of the filter 36 is coupled to a receive amplifier for amplifying radio-frequency signals in Band A.

The band rejection filter 35 is a first filter provided in the signal path 65 and configured to attenuate radio-frequency signals in Band A (second communication band) and pass radio-frequency signals in Band B (first communication band). The input end of the band rejection filter 35 is coupled to the selection terminal 25*b*, while the output end of the band rejection filter 35 is coupled to the selection terminal 45*b*.

The filter 36 and the band rejection filter 35 together define an extractor for Band A (2.4 GHz Wi-Fi band).

The signal path 64 is a bypass path without any filter.

A second filter configured to pass a first frequency range group including Bands B and A may be provided between the antenna connection terminal 100 and the common terminal 25*a*.

The front-end circuit 1B having the configuration described above exclusively switches between communication of radio-frequency receive signals in Band B from the antenna connection terminal 100 to the selection terminal 45*b* through the signal path 65 and communication of radio-frequency receive signals in Band B from the antenna connection terminal 100 to the selection terminal 45*c* through the signal path 64.

Figure 1C:
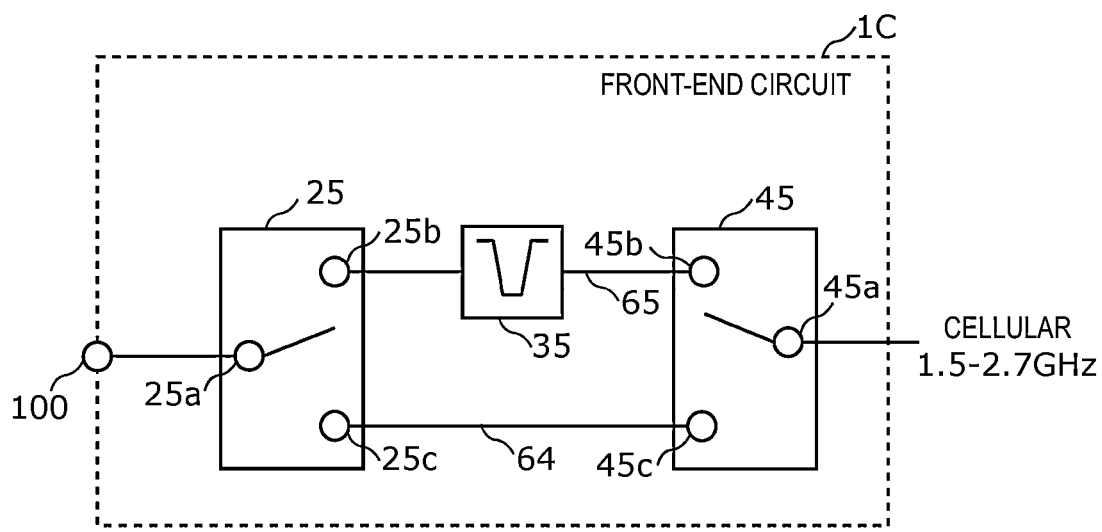
FIG. 1C is a circuit configuration diagram of a front-end circuit according to a second modification of the first preferred embodiment of the present invention.

FIG. 1C is a circuit configuration diagram of a front-end circuit 1C according to a second modification of the first preferred embodiment. The front-end circuit 1C according to the second modification differs from the front-end circuit 1B according to the first modification only in the absence of the signal path 66 and the filter 36 to communicate radio-frequency signals in Band A (2.4 GHz Wi-Fi band). Also with this configuration, the front-end circuit 1C exclusively switches between communication of radio-frequency receive signals in Band B from the antenna connection terminal 100 to the selection terminal 45*b* through the signal path 65 and communication of radio-frequency receive signals in Band B from the antenna connection terminal 100 to the selection terminal 45*c* through the signal path 64.

1.2 Signal Path Switching in Front-End Circuit

Figure 2A:
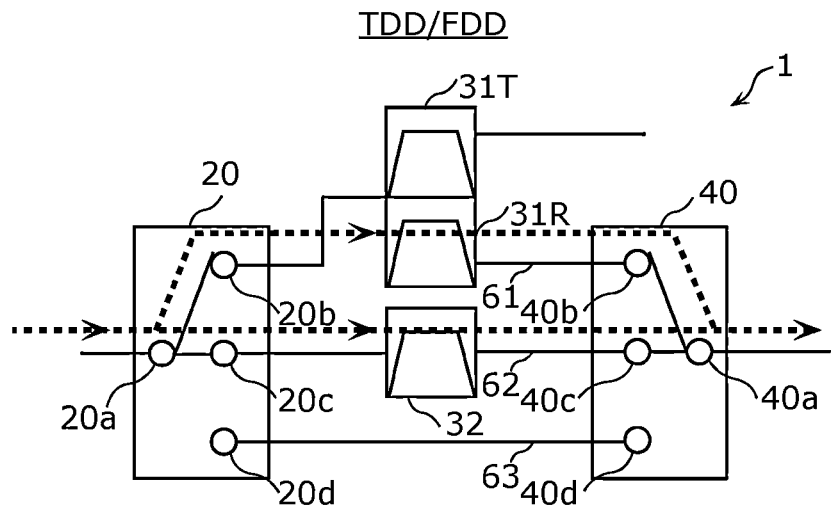
FIG. 2A illustrates the front-end circuit according to the first preferred embodiment of the present invention in a carrier aggregation (CA) (time division duplex (TDD)/frequency division duplex (FDD)) mode.

FIG. 2A illustrates the front-end circuit 1 according to the first preferred embodiment in a carrier aggregation (CA) (TDD/FDD) mode. As illustrated in FIG. 2A, when a radio-frequency receive signal in Band B (first communication band) according to the TDD system is received simultaneously with, for example, a radio-frequency receive signal in Band A according to the FDD system, the receive band of Band A is attenuated in the signal path 62 in consideration of interference with the radio-frequency receive signal in Band A according to the FDD system. More specifically, the switching circuit 20 connects the common terminal 20*a* and the selection terminal 20*b* and connects the common terminal 20*a* and the selection terminal 20*c*. Additionally, the switching circuit 40 connects the common terminal 40*a* and the selection terminal 40*b* and connects the common terminal 40*a* and the selection terminal 40*c*. In this manner, when a radio-frequency receive signal in Band B according to the TDD system is received simultaneously with a radio-frequency receive signal in Band A according to the FDD system, the switching circuit 20 selects the signal path 62 including the receive filter 32. This can reduce or prevent the mutual interference between the radio-frequency signal in Band B propagating along the signal path 62 and the radio-frequency receive signal in Band A.

Figure 2B:
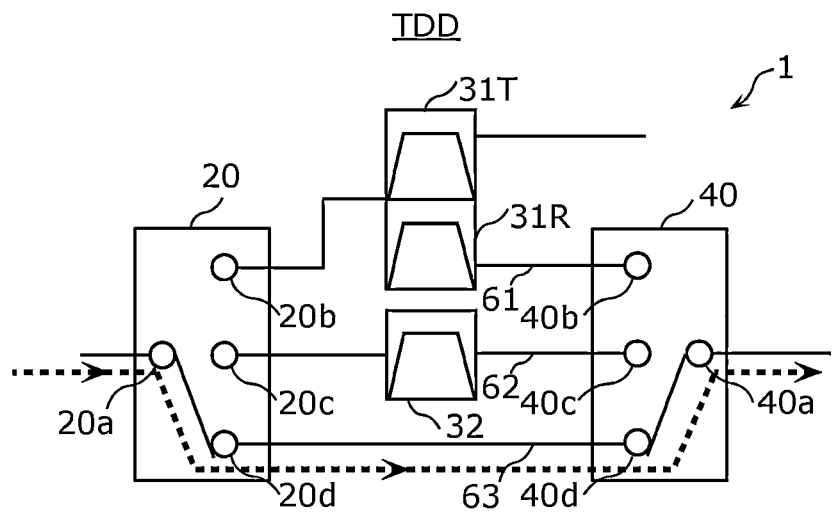
FIG. 2B illustrates the front-end circuit according to the first preferred embodiment of the present invention in a TDD-only mode.

FIG. 2B illustrates the front-end circuit 1 according to the first preferred embodiment in a TDD-only mode. As illustrated in FIG. 2B, when a radio-frequency receive signal in Band B according to the TDD system is solely received, there is no need to consider interference with other transmit or receive radio-frequency signals, and thus, it is unnecessary to attenuate radio-frequency signals of frequencies other than Band B. More specifically, the switching circuit 20 connects the common terminal 20*a* and the selection terminal 20*d*. Additionally, the switching circuit 40 connects the common terminal 40*a* and the selection terminal 40*d*. In this manner, when a radio-frequency receive signal in Band B according to the TDD system is solely received, the switching circuit 20 selects the signal path 63 without any filter, and as a result, it is possible to transfer the radio-frequency receive signal in Band B with low loss.

In the configuration described above, the common terminal 40*a* is coupled to the selection terminal 40*c* in the switching circuit 40, and the common terminal 20*a* is coupled to the selection terminal 20*c* in the switching circuit 20. Additionally, the common terminal 40*a* is coupled to the selection terminal 40*d* in the switching circuit 40, and the common terminal 20*a* is coupled to the selection terminal 20*d* in the switching circuit 20. This configuration enables the amplifier circuit coupled to the selection terminals 40*c* and 40*d* to be shared by using the signal paths 62 and 63, and consequently, it is possible to achieve simplification and downsizing of the circuit.

When the front-end circuit 1B according to the first modification simultaneously receives a radio-frequency receive signal in Band B (cellular band) according to the TDD system and, for example, a radio-frequency receive signal in Band A (2.4 GHz Wi-Fi band), the receive band corresponding to Band A (2.4 GHz Wi-Fi band) is attenuated in the signal path 65 in consideration of interference with the radio-frequency receive signal in Band A. More specifically, the switching circuit 25 connects the common terminal 25*a* and the selection terminal 25*b*. Additionally, the switching circuit 45 connects the common terminal 45*a* and the selection terminal 45*b*. In this manner, when a radio-frequency receive signal in Band B (cellular band) according to the TDD system is received simultaneously with a radio-frequency receive signal in Band A (e.g., 2.4 GHz Wi-Fi band), the signal paths 65 and 66 including the band rejection filter 35 and the filter 36 are selected. This can reduce or prevent the mutual interference between the radio-frequency signal in Band B propagating along the signal path 65 and the radio-frequency receive signal in Band A.

When a radio-frequency receive signal in Band B (cellular band) according to the TDD system is solely received, there is no need to consider interference with other transmit or receive radio-frequency signals, and thus, it is unnecessary to attenuate radio-frequency signals of frequencies other than Band B. More specifically, the switching circuit 25 connects the common terminal 25a and the selection terminal 25c. Additionally, the switching circuit 45 connects the common terminal 45a and the selection terminal 45c. In this manner, when a radio-frequency receive signal in Band B (cellular band) according to the TDD system is solely received, the signal path 64 without any filter is selected, and as a result, it is possible to transfer the radio-frequency receive signal in Band B (cellular band) with low loss.

When the front-end circuit 1C according to the second modification simultaneously receives a radio-frequency receive signal in Band B (cellular band) according to the TDD system and, for example, a radio-frequency receive signal in Band A (2.4 GHz Wi-Fi band), the receive band corresponding to Band A (e.g., 2.4 GHz Wi-Fi band) is attenuated in the signal path 65 in consideration of interference with the radio-frequency receive signal in Band A. More specifically, the switching circuit 25 connects the common terminal 25a and the selection terminal 25b. Additionally, the switching circuit 45 connects the common terminal 45a and the selection terminal 45b. In this manner, when a radio-frequency receive signal in Band B (cellular band) according to the TDD system is received simultaneously with a radio-frequency receive signal in Band A (e.g., 2.4 GHz Wi-Fi band), the signal path 65 including the band rejection filter 35 is selected. This can reduce or prevent the mutual interference between the radio-frequency signal in Band B propagating along the signal path 65 and the radio-frequency receive signal in Band A.

When a radio-frequency receive signal in Band B (cellular band) according to the TDD system is solely received, there is no need to consider interference with other transmit or receive radio-frequency signals, and thus, it is unnecessary to attenuate radio-frequency signals of frequencies other than Band B. More specifically, the switching circuit 25 connects the common terminal 25a and the selection terminal 25c. Additionally, the switching circuit 45 connects the common terminal 45a and the selection terminal 45c. In this manner, when a radio-frequency receive signal in Band B (cellular band) according to the TDD system is solely received, the signal path 64 without any filter is selected, and as a result, it is possible to transfer the radio-frequency receive signal in Band B (cellular band) with low loss.

Figure 3A:
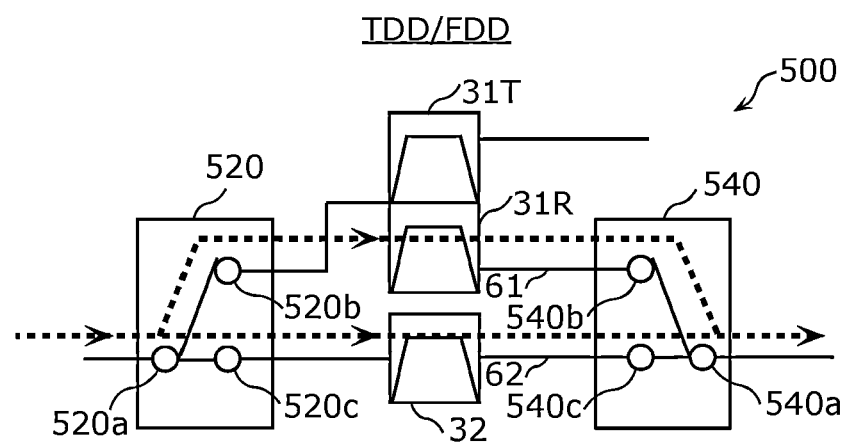
FIG. 3A illustrates a front-end circuit according to a first comparative example in the CA (TDD/FDD) mode.

FIG. 3A illustrates a front-end circuit 500 according to a first comparative example in the carrier aggregation (CA) (TDD/FDD) mode. The front-end circuit 500 according to the first comparative example differs from the front-end circuit 1 according to the first preferred embodiment in the absence of the signal path 63 without any filter. As illustrated in FIG. 3A, when a radio-frequency receive signal in Band B according to the TDD system is received simultaneously with, for example, a radio-frequency receive signal in Band A according to the FDD system, in the same or substantially the same manner as the front-end circuit 1 according to the first preferred embodiment, the receive band of Band A is attenuated in the signal path 62 in consideration of interference with the radio-frequency receive signal in Band A according to the FDD system. More specifically, a switching circuit 520 connects a common terminal 520a and a selection terminal 520b and connects the common terminal 520a and a selection terminal 520c. Additionally, a switching circuit 540 connects a common terminal 540a and a selection terminal 540b and connects the common terminal 540a and a selection terminal 540c. In this manner, when a radio-frequency receive signal in Band B according to the TDD system is received simultaneously with a radio-frequency receive signal in Band A according to the FDD system, the switching circuit 520 selects the signal path 62 including the receive filter 32. This can reduce or prevent the mutual interference between the radio-frequency signal in Band B propagating along the signal path 62 and the radio-frequency receive signal in Band A.

Figure 3B:
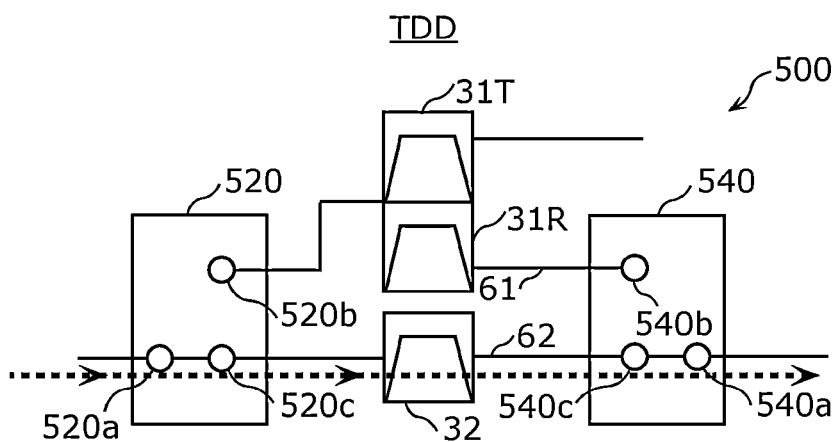
FIG. 3B illustrates the front-end circuit according to the first comparative example in the TDD-only mode.

FIG. 3B illustrates the front-end circuit 500 according to the first comparative example in the TDD-only mode. As illustrated in FIG. 3B, when a radio-frequency receive signal in Band B according to the TDD system is solely received, similarly to the case in which a radio-frequency receive signal in Band B is received simultaneously with a radio-frequency receive signal in Band A, the switching circuit 520 connects the common terminal 520a and the selection terminal 520b and connects the common terminal 520a and the selection terminal 520c. Additionally, the switching circuit 540 connects the common terminal 540a and the selection terminal 540b and connects the common terminal 540a and the selection terminal 540c. This means, also when a radio-frequency receive signal in Band B according to the TDD system is solely received, the switching circuit 520 selects the signal path 62 including the receive filter 32. As a result, when the front-end circuit 500 according to the first comparative example receives only a radio-frequency receive signal in Band B according to the TDD system, the radio-frequency receive signal passes through the receive filter 32, and thus, the propagation loss caused by the insertion loss due to the receive filter 32 cannot be reduced.

In contrast, with the configuration of the front-end circuit 1 according to the present preferred embodiment, when a radio-frequency signal according to the TDD system is solely received in a system capable of transferring radio-frequency signals while switching a plurality of communication systems such as TDD and FDD, the radio-frequency signal propagation loss can be reduced. When radio-frequency signals according to the TDD and FDD systems are simultaneously received, high-quality signal transfer can be achieved because mutual interference between the radio-frequency signals is reduced.

The front-end circuit 1 according to the present preferred embodiment has the configuration in which the signal paths 62 and 63 are switched to transfer a radio-frequency signal received by the antenna 2, but the signal paths 62 and 63 may be switched to output a radio-frequency signal from the antenna 2 via the front-end circuit 1. In this case, the receive filter 32 defines and functions as a transmit filter.

In this case, when a radio-frequency transmit signal in Band B (first communication band) according to the TDD system is received simultaneously with a radio-frequency transmit signal in Band A according to the FDD system, the transmit band of Band A is attenuated in the signal path 62 in consideration of interference with the radio-frequency signal in Band A according to the FDD system. More specifically, the switching circuit 20 connects the common terminal 20a and the selection terminal 20b and connects the common terminal 20a and the selection terminal 20c. Additionally, the switching circuit 40 connects the common terminal 40a and the selection terminal 40b and connects the common terminal 40a and the selection terminal 40c. In this manner, when a radio-frequency transmit signal in Band B according to the TDD system is transmitted simultaneously with a radio-frequency transmit signal in Band A according to the FDD system, the switching circuit 20 selects the signal path 62 including the transmit filter. This can reduce or prevent the mutual interference with the radio-frequency signal in Band A.

When a radio-frequency transmit signal in Band B according to the TDD system is solely transmitted, there is no need to consider interference with other transmit or receive radio-frequency signals, and thus, it is unnecessary to attenuate radio-frequency signals of frequencies other than Band B. More specifically, the switching circuit 20 connects the common terminal 20a and the selection terminal 20d. Additionally, the switching circuit 40 connects the common terminal 40a and the selection terminal 40d. In this manner, when a radio-frequency transmit signal in Band B according to the TDD system is solely received, the switching circuit 20 selects the signal path 63 without any transmit filter, and as a result, it is possible to transfer the radio-frequency transmit signal in Band B with low loss.

The filter 10 is not necessary in the front-end circuit 1 according to the present preferred embodiment. However, since the filter 10 is provided, harmonic waves of radio-frequency signals in Bands A and B can be prevented from being outputted to a path other than the signal paths 61 to 63. Furthermore, it is possible to achieve high-quality simultaneous communication of radio-frequency signals in Band A or B and radio-frequency signals in a frequency range group other than the first frequency range group.

The switching circuits 20 and 40 may be collectively provided as a single chip. This structure can shorten the signal paths 61 to 63 coupled at both ends to the switching circuits 20 and 40, and as a result, it is possible to further reduce the loss of radio-frequency signals in Bands A and B.

The chip may be made using complementary metal oxide semiconductor (CMOS), for example. The chip may include, for example, a portion of a controller 7 configured or programmed to control switching of the switching circuits 20 and 40, the transmit amplifier, and the receive amplifier. This enables the switching circuits 20 and 40, the amplifier circuits, and the controller 7 to be provided as a single CMOS chip, and as a result, the front-end circuit 1 can be inexpensively manufactured. The chip may be made of GaAs, for example. This enables output of radio-frequency signals with high amplification performance and low-noise performance.

The switching circuit 40 is not necessarily included in the front-end circuit 1 according to the present preferred embodiment. Also in this case, the switching circuit 20 performs switching in accordance with (1) the case in which a radio-frequency receive signal in Band B according to the TDD system is received simultaneously with a radio-frequency receive signal in Band A according to the FDD system or (2) the case in which a radio-frequency receive signal in Band B according to the TDD system is solely received. When a radio-frequency receive signal in Band B according to the TDD system is solely received, the switching circuit 20 selects the signal path 63 without any transmit filter, and as a result, the radio-frequency transmit signal in Band B can be transferred with low loss. In this case, the selection terminal 40b is the fourth input-output terminal to output radio-frequency signals in Band A from the front-end circuit 1, the selection terminal 40c is the second input-output terminal to output radio-frequency signals in Band B from the front-end circuit 1, and the selection terminal 40d is the third input-output terminal to output radio-frequency signals in Band B from the front-end circuit 1. In the configuration without the switching circuit 40, receive amplifiers need to be provided for both of the signal paths 62 and 63.

Figure 1D:
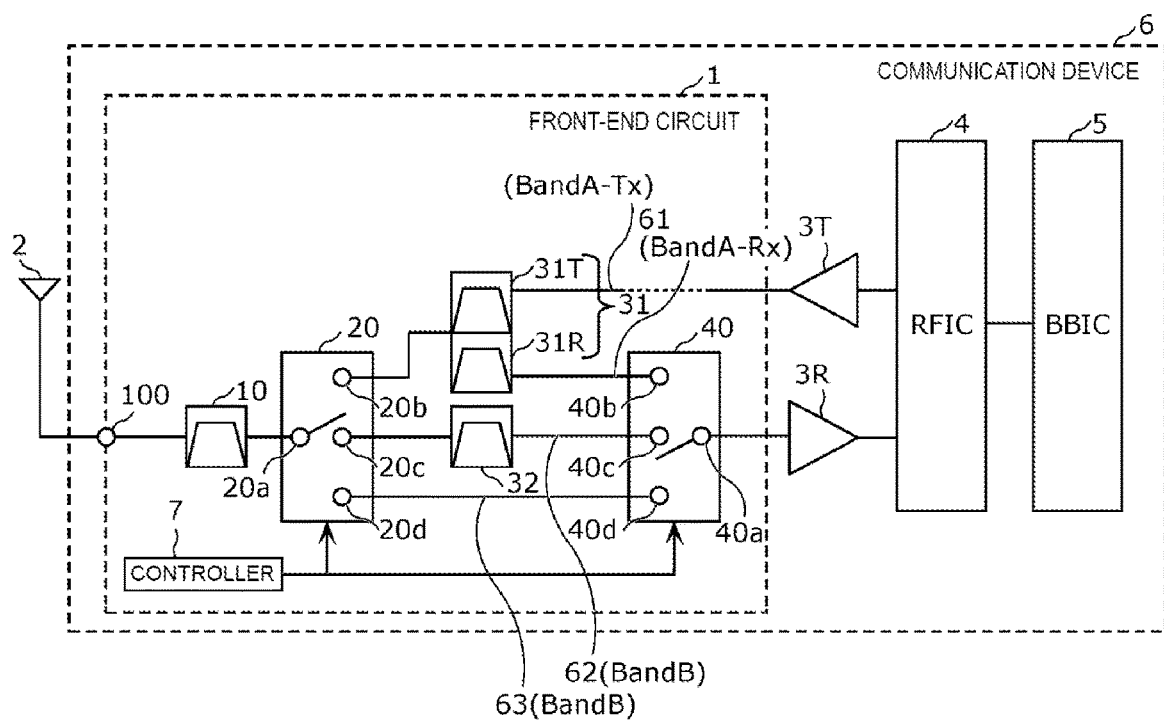
FIG. 1D is a circuit configuration diagram of a front-end circuit and a communication device according to a preferred embodiment of the present invention.

The front-end circuit 1 according to the present preferred embodiment may include the controller 7 configured or programmed to control switching of the switching circuits 20 and 40, as shown in FIG. 1D. In this case, when a radio-frequency signal in Band B according to the TDD system is solely transferred, the controller 7 connects the common terminal 20a to the selection terminal 20d and the common terminal 40a to the selection terminal 40d. Conversely, when a radio-frequency signal in Band B according to the TDD system and a radio-frequency signal in Band A according to the FDD system are simultaneously transferred, the controller 7 connects the common terminal 20a to the selection terminal 20c and the common terminal 40a to the selection terminal 40c. As such, the controller 7 included in the front-end circuit 1 controls switching of the switching circuits 20 and 40 by receiving information about selection of the TDD/FDD communication systems. This configuration improves the performance of the front-end circuit 1 and shortens the communication line of control signal, which enables high speed switching.

The controller 7 may be included not in the front-end circuit 1 but, for example, the RFIC 4 as shown in FIG. 1A or the BBIC 5. In this case, the communication device 6 includes the controller.

The front-end circuit 1 according to the present preferred embodiment may include at least one of the receive amplifier 3R and the transmit amplifier 3T.

1.3 Conclusion of First Preferred Embodiment

The front-end circuit 1 according to the present preferred embodiment includes the first input-output terminal (the antenna connection terminal 100), the second input-output terminal (the selection terminal 40c), and the third input-output terminal (the selection terminal 40d), which are used to input a radio-frequency signal to the front-end circuit 1 or output a radio-frequency signal from the front-end circuit 1, the switching circuit 20 including the common terminal 20a coupled to the antenna connection terminal 100 and the selection terminals 20c and 20d and configured to exclusively connect the common terminal 20a to the selection terminal 20c or 20d, the receive filter 32 configured to pass a radio-frequency signal in Band B (first communication band), the signal path 62 connecting the selection terminals 20c and 40c and including the receive filter 32, and the signal path 63 connecting the selection terminal 20d and the selection terminal 40d and defining and functioning as a bypass path without any filter. The front-end circuit 1 exclusively switches between communication of radio-frequency signals in Band B from the antenna connection terminal 100 to the selection terminal 40c through the signal path 62 and communication of radio-frequency signals in Band B from the antenna connection terminal 100 to the selection terminal 40d through the signal path 63.

With this configuration, when a radio-frequency signal in Band B is solely received, there is no need to consider interference with other transmit or receive radio-frequency signals, and thus, it is unnecessary to attenuate radio-frequency signals of frequencies other than Band B. For this reason, in this case, the switching circuit 20 selects the signal path 63 without any filter, and consequently, the radio-frequency signal in Band B can be transferred with low loss.

Conversely, when a radio-frequency signal in Band B is received simultaneously with a radio-frequency signal in a different band, the different band is attenuated in consideration of interference with the radio-frequency signal in the different band. For this reason, in this case, the switching circuit 20 selects the signal path 62 including the receive filter 32, and as a result, it is possible to hinder mutual interference with the radio-frequency signal in the different band.

Alternatively, the front-end circuit 1 according to the present preferred embodiment includes the first input-output terminal (the antenna connection terminal 100), the second input-output terminal (the selection terminal 40c), and the third input-output terminal (the selection terminal 40d), which are used to input a radio-frequency signal to the front-end circuit 1 or output a radio-frequency signal from the front-end circuit 1, the switching circuit 20 including the common terminal 20a and the selection terminals 20c and 20d and configured to exclusively connect the common terminal 20a to the selection terminal 20c or 20d, the receive filter 32 configured to pass a radio-frequency signal in Band B, the signal path 62 that connects the selection terminals 20c and 40c, that includes the receive filter 32, and that is used to transfer a radio-frequency signal in Band B, the signal path 63 that connects the selection terminal 20d and the selection terminal 40d, that defines and functions as a bypass path without any filter, and that is used to transfer a radio-frequency signal in Band B, and the filter 10 coupled between the antenna connection terminal 100 and the common terminal 20a and configured to pass the first frequency range group including Band B.

With this configuration, when a radio-frequency signal in Band B is solely received, there is no need to consider interference with other transmit or receive radio-frequency signals, and thus, it is unnecessary to attenuate radio-frequency signals of frequencies other than Band B. For this reason, in this case, the switching circuit 20 selects the signal path 63 without any filter, and consequently, the radio-frequency signal in Band B can be transferred with low loss. Conversely, when a radio-frequency signal in Band B is received simultaneously with a radio-frequency signal in a different band, the different band is attenuated in consideration of interference caused when the radio-frequency signal in the different band is received or being transmitted. For this reason, in this case, the switching circuit 20 selects the signal path 62 including the receive filter 32, and as a result, it is possible to reduce or prevent mutual interference with the radio-frequency signal in the different band. Furthermore, it is possible to reduce or prevent the output of harmonic waves in Band B by using the filter 10, and it is possible to achieve simultaneous communication of radio-frequency signals in Band B and radio-frequency signals in a frequency range group other than the first frequency range group.

Second Preferred Embodiment

A second preferred embodiment of the present invention will describe a front-end circuit including two or more routes provided by the front-end circuit 1 according to the first preferred embodiment and capable of providing CA in the different front-end circuits.

2.1 Circuit Configuration of Front-End Circuit

Figure 4:
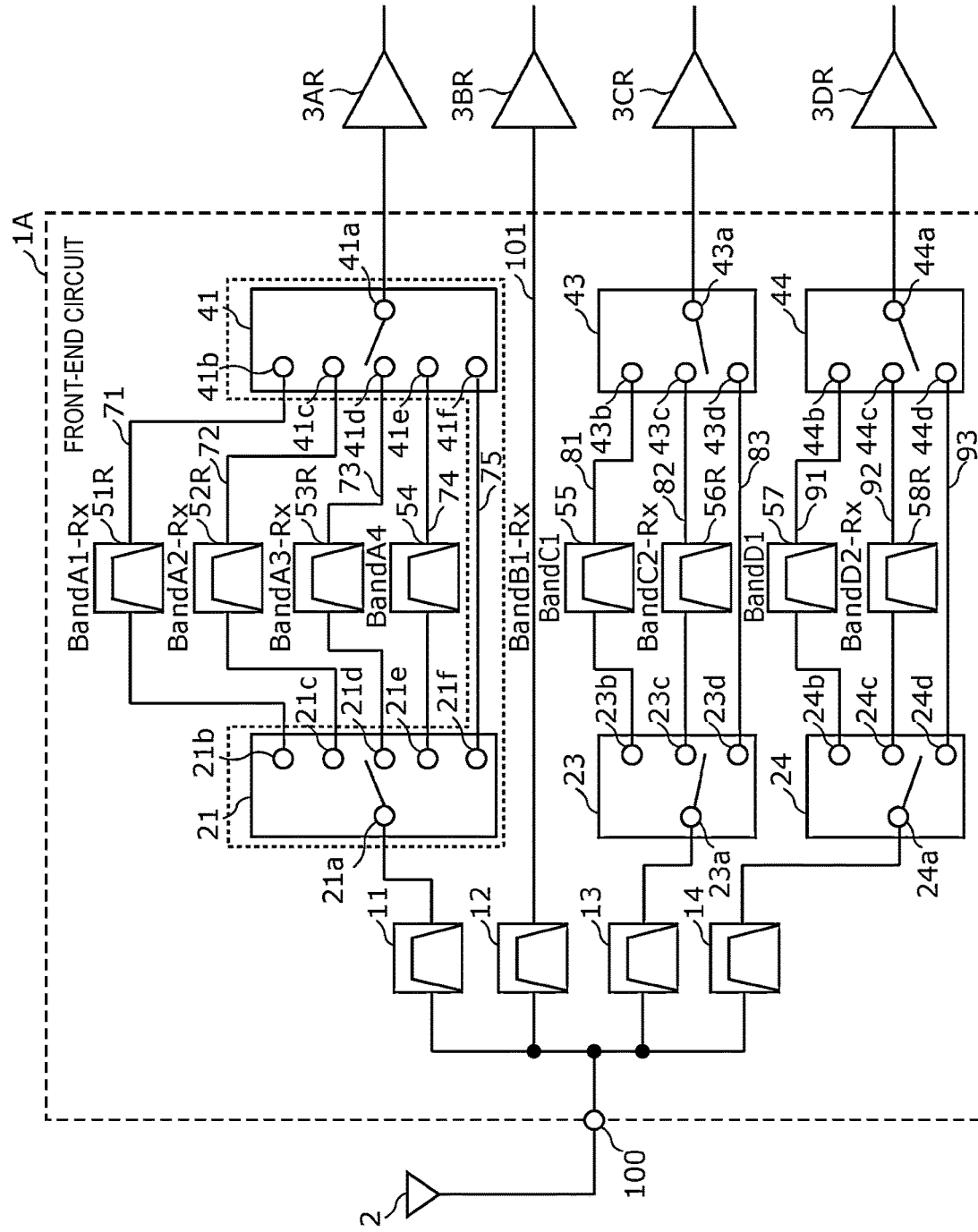
FIG. 4 is a circuit configuration diagram of a front-end circuit according to a second preferred embodiment of the present invention.

FIG. 4 is a circuit configuration diagram of a front-end circuit 1A according to the second preferred embodiment. As illustrated in FIG. 4, the front-end circuit 1A includes switching circuits 21, 23, 24, 41, 43, and 44, signal paths 71, 72, 73, 74, 75, 81, 82, 83, 91, 92, 93, and 101, receive filters 51R, 52R, 53R, 54, 55, 56R, 57, and 58R, filters 11, 12, 13, and 14, and the antenna connection terminal 100. The front-end circuit 1A is provided at a front-end of, for example, a multimode/multiband mobile phone.

The front-end circuit 1A includes four routes defined by circuit units coupled to the antenna connection terminal 100. The circuit unit corresponds to the front-end circuit 1 according to the first preferred embodiment. A first circuit unit includes the switching circuits 21 and 41, the signal paths 71 to 75, the receive filters 51R, 52R, 53R, 54, and 55, and the filter 11. A second circuit unit includes the signal path 101 and the filter 12. A third circuit unit includes the switching circuits 23 and 43, the signal paths 81 to 83, the receive filters 55 and 56R, and the filter 13. A fourth circuit unit includes the switching circuits 24 and 44, the signal paths 91 to 93, the receive filters 57 and 58R, and the filter 14.

The switching circuit 21 is a first switching circuit including a common terminal 21a (first common terminal), a selection terminal 21b (fifth selection terminal), a selection terminal 21c, a selection terminal 21d, a selection terminal 21e (first selection terminal), and a selection terminal 21f (second selection terminal) and is configured to exclusively connect the common terminal 21a to the selection terminal 21e or 21f.

The common terminal 21a is coupled to the antenna connection terminal 100 (first input-output terminal) via the filter 11. The selection terminal 21b is coupled to the signal path 71, the selection terminal 21c is coupled to the signal path 72, the selection terminal 21d is coupled to the signal path 73, the selection terminal 21e is coupled to the signal path 74, and the selection terminal 21f is coupled to the signal path 75.

The switching circuit 41 is a second switching circuit including a common terminal 41a (second common terminal), a selection terminal 41b, a selection terminal 41c, a selection terminal 41d, a selection terminal 41e (third selection terminal), and a selection terminal 41f (fourth selection terminal) and is configured to exclusively connect the common terminal 41a to the selection terminal 41e or 41f. The selection terminal 41b corresponds to a fourth input-output terminal to output radio-frequency signals in Band A1 from the front-end circuit 1A. The selection terminal 41e corresponds to a second input-output terminal to output radio-frequency signals in Band A4 from the front-end circuit 1A. The selection terminal 41f corresponds to a third input-output terminal to output radio-frequency signals in Band A4 from the front-end circuit 1A.

The common terminal 41a is coupled to a receive amplifier 3AR and configured to output a radio-frequency signal from the front-end circuit 1A to the receive amplifier 3AR.

The selection terminal 41b is coupled to the signal path 71, the selection terminal 41c is coupled to the signal path 72, the selection terminal 41d is coupled to the signal path 73, the selection terminal 41e is coupled to the signal path 74, and the selection terminal 41f is coupled to the signal path 75.

The signal path 71 is a third signal path that is used to transfer radio-frequency signals in Band A1 (second communication band) and that connects the selection terminal 21b and the selection terminal 41b. The signal path 72 is a third signal path that is used to transfer radio-frequency signals in Band A2 and that connects the selection terminal 21c and the selection terminal 41c. The signal path 73 is a third signal path that is used to transfer radio-frequency signals in Band A3 and that connects the selection terminal 21*d* and the selection terminal 41*d*. The signal path 74 is a first signal path that is used to transfer radio-frequency signals in Band A4 (first communication band) and that connects the selection terminal 21*e* and the selection terminal 41*e*. The signal path 75 is a second signal path that is used to transfer radio-frequency signals in Band A4 (first communication band) and that connects the selection terminal 21*f* and the selection terminal 41*f*.

The receive filter 51R receives radio-frequency signals in Band A1 in accordance with the FDD system. The input end of the receive filter 51R is coupled to the selection terminal 21*b* via the signal path 71, while the output end of the receive filter 51R is coupled to the selection terminal 41*b* via the signal path 71. The receive filter 51R is a third filter provided in the signal path 71.

The receive filter 52R receives radio-frequency signals in Band A2 in accordance with the FDD system. The input end of the receive filter 52R is coupled to the selection terminal 21*c* via the signal path 72, while the output end of the receive filter 52R is coupled to the selection terminal 41*c* via the signal path 72. The receive filter 52R is a third filter provided in the signal path 72.

The receive filter 53R receives radio-frequency signals in Band A3 in accordance with the FDD system. The input end of the receive filter 53R is coupled to the selection terminal 21*d* via the signal path 73, while the output end of the receive filter 53R is coupled to the selection terminal 41*d* via the signal path 73. The receive filter 53R is a third filter provided in the signal path 73.

The receive filter 54 is a first filter configured to pass radio-frequency signals in, for example, Band A4 (first communication band) and provided in the signal path 74. The receive filter 54 is a filter configured to receive radio-frequency signals in Band A4 (first communication band) in accordance with the TDD system.

The signal path 75 is a bypass path without any filter.

The signal paths 74 and 75 are used to transfer radio-frequency signals in Band A4 according to the TDD system.

The filter 11 is a second filter coupled between the antenna connection terminal 100 and the common terminal 21*a* and configured to pass a first frequency range group including Bands A1 to A4.

With the configuration described above, the front-end circuit 1A exclusively switches between communication of radio-frequency receive signals in Band A4 from the antenna connection terminal 100 to the selection terminal 41*e* through the signal path 74 and communication of radio-frequency receive signals in Band A4 from the antenna connection terminal 100 to the selection terminal 41*f* through the signal path 75.

It should be noted that the front-end circuit 1A according to the present preferred embodiment only needs to include at least one of the signal paths 71 to 73. Accordingly, the switching circuits 21 and 41 include selection terminals the same in number to signal paths.

The signal path 101 is a path used to transfer radio-frequency signals in Band B1 and connecting the filter 12 and the receive amplifier 3BR.

The filter 12 is coupled between the antenna connection terminal 100 and the signal path 101 and configured to pass a second frequency range group including Band B1.

The signal path 101 is used to transfer radio-frequency signals in Band B1 according to the FDD system.

In the present preferred embodiment, the communication band belonging to the second frequency range group is only Band B1, and thus, there is no need to consider interference with other communication bands in the second frequency range group. Thus, the signal path 101 includes no filter. It should be noted that the filter 12 and the signal path 101 are not necessary in the front-end circuit 1A according to the present preferred embodiment.

The switching circuit 23 is a third switching circuit including a common terminal 23*a* (third common terminal), a selection terminal 23*b* (sixth selection terminal), a selection terminal 23*c* (eighth selection terminal), and a selection terminal 23*d* (seventh selection terminal) and is configured to exclusively connect the common terminal 23*a* to the selection terminal 23*b* or 23*d*.

The common terminal 23*a* is coupled to the antenna connection terminal 100 (first input-output terminal) via the filter 13. The selection terminal 23*b* is coupled to the signal path 81, the selection terminal 23*c* is coupled to the signal path 82, and the selection terminal 23*d* is coupled to the signal path 83.

The switching circuit 43 includes a common terminal 43*a*, a selection terminal 43*b*, a selection terminal 43*c*, and a selection terminal 43*d* and is configured to exclusively connect the common terminal 43*a* to the selection terminal 43*b* or 43*d*. The selection terminal 43*b* corresponds to a fifth input-output terminal to output radio-frequency signals in Band C1 from the front-end circuit 1A. The selection terminal 43*c* corresponds to a seventh input-output terminal to output radio-frequency signals in Band C2 from the front-end circuit 1A. The selection terminal 43*d* corresponds to a sixth input-output terminal to output radio-frequency signals in Band C1 from the front-end circuit 1A.

The common terminal 43*a* is coupled to a receive amplifier 3CR and configured to output a radio-frequency signal from the front-end circuit 1A to the receive amplifier 3CR.

The selection terminal 43*b* is coupled to the signal path 81, the selection terminal 43*c* is coupled to the signal path 82, and the selection terminal 43*d* is coupled to the signal path 83.

The signal path 81 is a fourth signal path that is used to transfer radio-frequency signals in Band C1 (third communication band) and that connects the selection terminal 23*b* and the selection terminal 43*b*. The signal path 82 is a sixth signal path that is used to transfer radio-frequency signals in Band C2 (fourth communication band) and that connects the selection terminal 23*c* and the selection terminal 43*c*. The signal path 83 is a fifth signal path that is used to transfer radio-frequency signals in Band C1 (third communication band) and that connects the selection terminal 23*d* and the selection terminal 43*d*.

The receive filter 55 is a fifth filter configured to pass radio-frequency signals in Band C1 (third communication band) and provided in the signal path 81. The receive filter 55 is a filter configured to receive radio-frequency signals in Band C1 (third communication band) in accordance with the TDD system.

The receive filter 56R receives radio-frequency signals in Band C2 in accordance with the FDD system. The input end of the receive filter 56R is coupled to the selection terminal 23*c* via the signal path 82, while the output end of the receive filter 56R is coupled to the selection terminal 43*c* via the signal path 82. The receive filter 56R is a sixth filter provided in the signal path 82.

The signal path 83 is a bypass path without any filter.

The signal paths 81 and 83 are used to transfer radio-frequency signals in Band C1 according to the TDD system.

The filter 13 is a fourth filter coupled between the antenna connection terminal 100 and the common terminal 23*a* and configured to pass a third frequency range group including Bands C1 and C2.

With the configuration described above, the front-end circuit 1A exclusively switches between communication of radio-frequency receive signals in Band C1 from the antenna connection terminal 100 to the selection terminal 43b through the signal path 81 and communication of radio-frequency receive signals in Band C1 from the antenna connection terminal 100 to the selection terminal 43c through the signal path 83.

The switching circuit 24 is a third switching circuit including a common terminal 24a (third common terminal), a selection terminal 24b (sixth selection terminal), a selection terminal 24c (eighth selection terminal), and a selection terminal 24d (seventh selection terminal) and is configured to exclusively connect the common terminal 24a to the selection terminal 24b or 24d.

The common terminal 24a is coupled to the antenna connection terminal 100 (first input-output terminal) via the filter 14. The selection terminal 24b is coupled to the signal path 91, the selection terminal 24c is coupled to the signal path 92, and the selection terminal 24d is coupled to the signal path 93.

The switching circuit 44 includes a common terminal 44a, a selection terminal 44b, a selection terminal 44c, and a selection terminal 44d and is configured to exclusively connect the common terminal 44a to the selection terminal 44b or 44d. The selection terminal 44b corresponds to a fifth input-output terminal to output radio-frequency signals in Band D1 from the front-end circuit 1A. The selection terminal 44c corresponds to a seventh input-output terminal to output radio-frequency signals in Band D2 from the front-end circuit 1A. The selection terminal 44d corresponds to a sixth input-output terminal to output radio-frequency signals in Band D1 from the front-end circuit 1A.

The common terminal 44a is coupled to a receive amplifier 3DR and configured to output a radio-frequency signal from the front-end circuit 1A to the receive amplifier 3DR.

The selection terminal 44b is coupled to the signal path 91, the selection terminal 44c is coupled to the signal path 92, and the selection terminal 44d is coupled to the signal path 93.

The signal path 91 is a fourth signal path that is used to transfer radio-frequency signals in Band D1 (third communication band) and that connects the selection terminal 24b and the selection terminal 44b. The signal path 92 is a sixth signal path that is used to transfer radio-frequency signals in Band D2 (fourth communication band) and that connects the selection terminal 24c and the selection terminal 44c. The signal path 93 is a fifth signal path that is used to transfer radio-frequency signals in Band D1 (third communication band) and that connects the selection terminal 24d and the selection terminal 44d.

The receive filter 57 is a fifth filter configured to pass radio-frequency signals in Band D1 (third communication band) and provided in the signal path 91. The receive filter 57 is configured to receive radio-frequency signals in Band D1 (third communication band) in accordance with the TDD system.

The receive filter 58R receives radio-frequency signals in Band D2 in accordance with the FDD system. The input end of the receive filter 58R is coupled to the selection terminal 24c via the signal path 92, while the output end of the receive filter 58R is coupled to the selection terminal 44c via the signal path 92. The receive filter 58R is a sixth filter provided in the signal path 92.

The signal path 93 is a bypass path without any filter.

The signal paths 91 and 93 are used to transfer radio-frequency signals in Band D1 according to the TDD system.

The filter 14 is a fourth filter coupled between the antenna connection terminal 100 and the common terminal 24a and configured to pass a fourth frequency range group including Bands D1 and D2.

With the configuration described above, the front-end circuit 1A exclusively switches between communication of radio-frequency receive signals in Band D1 from the antenna connection terminal 100 to the selection terminal 44b through the signal path 91 and communication of radio-frequency receive signals in Band D1 from the antenna connection terminal 100 to the selection terminal 44c through the signal path 93.

Since the filters 11 to 14 are provided, each filter reduces or prevents leakage of harmonic waves of radio-frequency signals in a corresponding one frequency range group into circuit units supporting other frequency range groups. Thus, it is possible to achieve high-quality simultaneous communication of radio-frequency signals in different frequency range groups.

The respective receive filters and the filters 11 to 14 may be, for example, surface acoustic wave filters, boundary acoustic wave filters, or BAW filters. The respective receive filters and the filters 11 to 14 are not necessarily acoustic wave filters but may be, for example, LC filters or dielectric filters, in other words, filters configured in any suitable manner.

The front-end circuit 1 according to the present preferred embodiment does not necessarily include both of the circuit to transfer radio-frequency signals in Bands C1 and C2 and the circuit to transfer radio-frequency signals in Bands D1 and D2.

Band A4 (first communication band) is, for example, LTE Band 39 (frequency range: about 1880 MHz-about 1920 MHz). Band C1 (third communication band) is, for example, LTE Band 40 (frequency range: about 2300 MHz-about 2400 MHz). Band D1 (third communication band) is, for example, LTE Band 41 (frequency range: about 2496 MHz-about 2690 MHz).

In this case, the filter 11 is a low pass filter of a pass band corresponding to, for example, the middle-low band (MLB: about 1475.9 MHz-about 2025 MHz). The filter 12 is a band pass filter of a pass band corresponding to, for example, a middle band (MB: about 2110 MHz-about 2200 MHz). The filter 13 is a band pass filter of a pass band corresponding to, for example, the middle-high band (MHB: about 2300 MHz-about 2400 MHz). The filter 14 is a band pass filter of a pass band corresponding to, for example, the high band (HB: about 2496 MHz-about 2690 MHz).

Band A1 is, for example, LTE Band 3 (receive band: about 1805 MHz-about 1880 MHz). Band A2 is, for example, LTE Band 25 (receive band: about 1930 MHz-about 1995 MHz). Band A3 is, for example, LTE Band 34 (frequency range: about 2010 MHz-about 2025 MHz). Band B1 is, for example, LTE Band 1/66 (receive band: about 2110 MHz-about 2200 MHz). Band C2 is, for example, LTE Band 30 (receive band: about 2350 MHz-about 2360 MHz). Band D2 is, for example, LTE Band 7 (receive band: about 2620 MHz-about 2690 MHz).

This means that one of the four different frequency range groups of the middle-low band, the middle band, the middle-high band, and the high band may include both Band A4 (first communication band) and Bands A1 to A3 (second communication band). One of the four different frequency range groups may include, for example, both Band C1 (third communication band) and Band C2 (fourth communication band). One of the four different frequency range groups may include, for example, both Band D1 (third communication band) and Band D2 (fourth communication band).

2.2 Signal Path Switching in Front-End Circuit

Figure 5A:
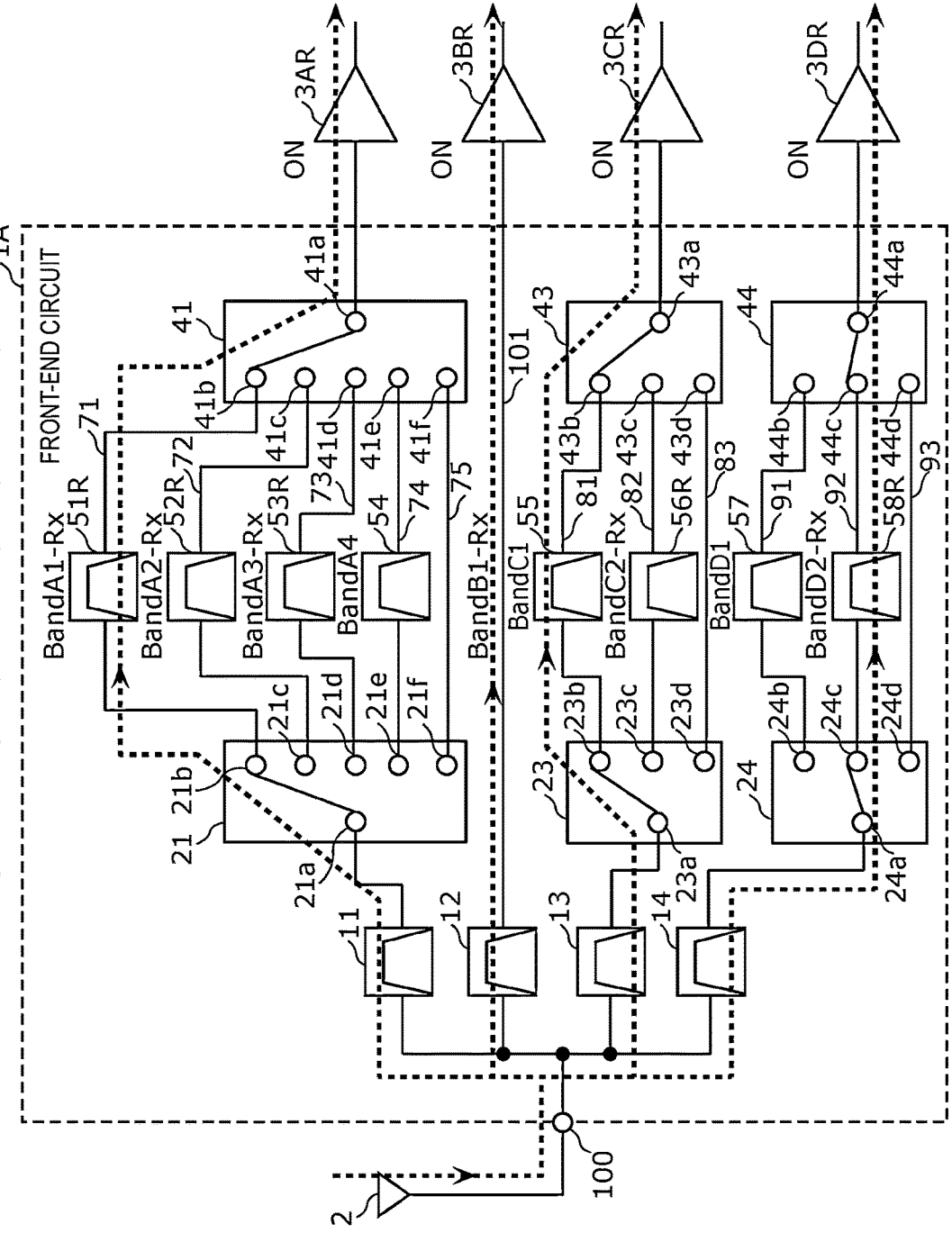
FIG. 5A illustrates the front-end circuit according to the second preferred embodiment of the present invention in the CA (TDD/FDD) mode.

FIG. 5A illustrates a front-end circuit according to the second preferred embodiment in the CA (TDD/FDD) mode. As illustrated in FIG. 5A, when a radio-frequency receive signal in Band C1 (third communication band) according to the TDD system is received simultaneously with, for example, a radio-frequency receive signal in Band A1 according to the FDD system, a radio-frequency receive signal in Band B1 according to the FDD system, and a radio-frequency receive signal in Band D2 according to the FDD system, the receive bands of Bands A1, B1, and D2 are attenuated in the signal path 81 in consideration of interference with the radio-frequency receive signals in Bands A1, B1, and D2 according to the FDD system. More specifically, the switching circuit 23 connects the common terminal 23a and the selection terminal 23b. The switching circuit 21 connects the common terminal 21a and the selection terminal 21b. The switching circuit 24 connects the common terminal 24a and the selection terminal 23c. Additionally, the switching circuit 43 connects the common terminal 43a and the selection terminal 43b. The switching circuit 41 connects the common terminal 41a and the selection terminal 41b. The switching circuit 44 connects the common terminal 44a and the selection terminal 43c. Additionally, the receive amplifiers 3AR, 3BR, 3CR, and 3DR are activated. In this manner, when a radio-frequency receive signal in Band C1 according to the TDD system is received simultaneously with radio-frequency receive signals in Bands A1, B1, and D2 according to the FDD system, the switching circuit 23 selects the signal path 81 including the receive filter 55. This can reduce or prevent the mutual interference with the radio-frequency signals in Bands A1, B1, and D2.

Figure 5B:
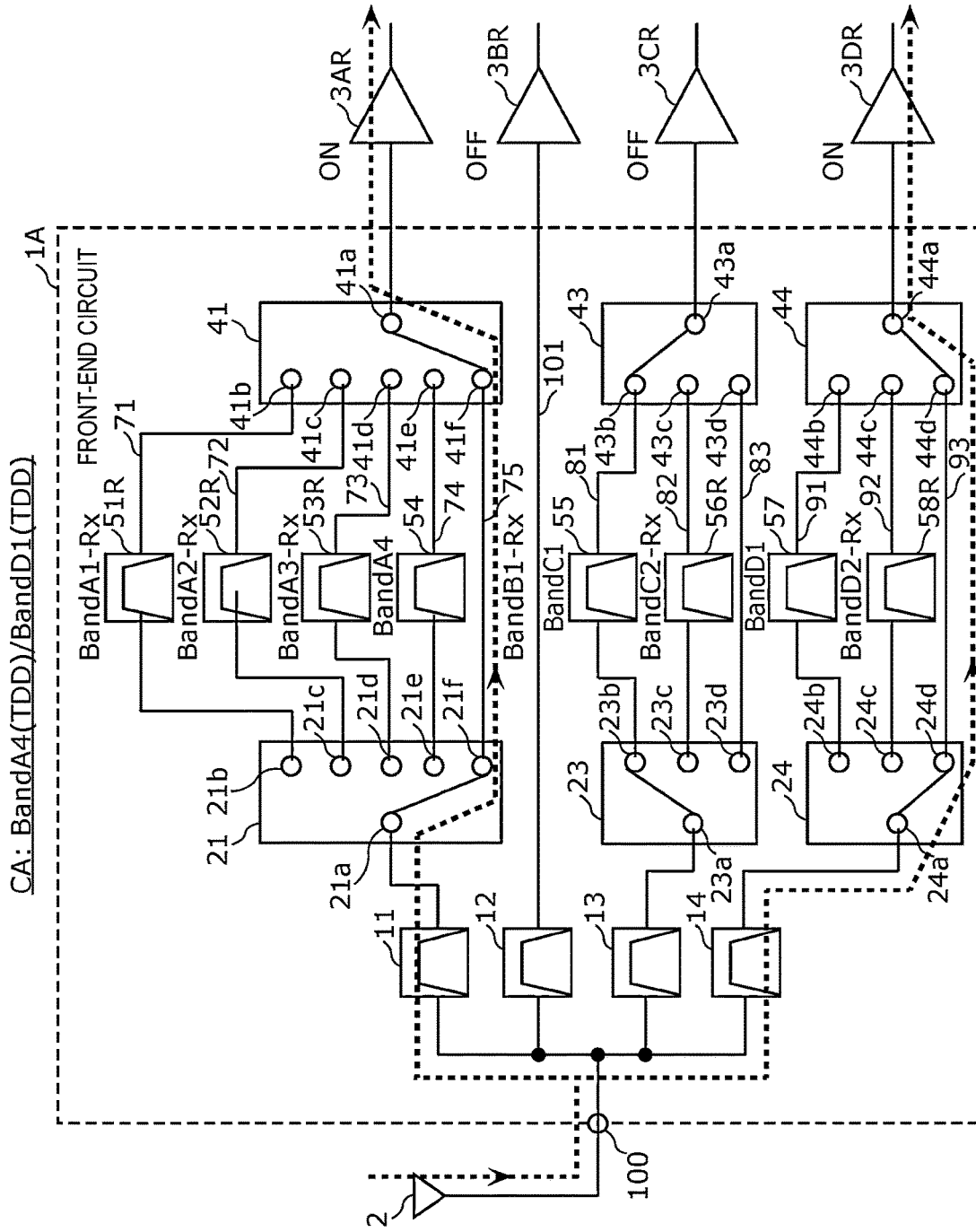
FIG. 5B illustrates the front-end circuit according to the second preferred embodiment of the present invention in the TDD-only mode.

FIG. 5B illustrates the front-end circuit 1A according to the second preferred embodiment in the TDD-only mode. As illustrated in FIG. 5B, when a radio-frequency receive signal in Band A4 according to the TDD system and a radio-frequency receive signal in Band D1 according to the TDD system are synchronously received (the TDD-only mode), there is no need to consider interference with radio-frequency transmit or receive signals other than synchronously traveling radio-frequency receive signals in Bands A4 and D1, and thus, it is unnecessary to attenuate radio-frequency signals other than synchronously traveling radio-frequency receive signals in Bands A4 and D1. More specifically, the switching circuit 21 connects the common terminal 21a and the selection terminal 21f. The switching circuit 41 connects the common terminal 41a and the selection terminal 41f. Additionally, the switching circuit 24 connects the common terminal 24a and the selection terminal 24d. The switching circuit 44 connects the common terminal 44a and the selection terminal 44d. Additionally, the receive amplifiers 3AR and 3DR are activated, while the receive amplifiers 3BR and 3CR are deactivated. In this manner, when radio-frequency receive signals according to the TDD system are received in the TDD-only mode, the switching circuits 21 and 24 select the signal paths 75 and 93 without any filter, and as a result, it is possible to transfer the radio-frequency receive signals in Bands A4 and D1 with low loss.

The TDD-only mode is not limited to the case of receiving a radio-frequency signal in a single communication band used in the TDD system, but the TDD-only mode includes the case of synchronously receiving radio-frequency signals in multiple communication bands used in the TDD system. However, the TDD-only mode excludes the case of asynchronously receiving radio-frequency signals in multiple communication bands used in the TDD system.

FIG. 6 illustrates a front-end circuit 500A according to a second comparative example in the TDD-only mode. The front-end circuit 500A according to the second comparative example differs from the front-end circuit 1A according to the second preferred embodiment in the absence of the signal paths 75 and 93 without any filter. As illustrated in FIG. 6, also when a radio-frequency receive signal in Band A4 according to the TDD system and a radio-frequency receive signal in Band D1 according to the TDD system are synchronously received (the TDD-only mode), similarly to when radio-frequency receive signals in Bands A4 and D1 according to the TDD system and other radio-frequency receive signals according to the FDD system are simultaneously received, a switching circuit 521 connects a common terminal 521a and a selection terminal 521e while a switching circuit 541 connects a common terminal 541a and a selection terminal 541e. Additionally, a switching circuit 524 connects a common terminal 524a and a selection terminal 524b. A switching circuit 544 connects a common terminal 544a and a selection terminal 544b. Additionally, the receive amplifiers 3AR and 3DR are activated, while the receive amplifiers 3BR and 3CR are deactivated. This means in the TDD-only mode using Bands A4 and D1 the switching circuits 521 and 524 select the signal path 74 including the receive filter 54 and the signal path 91 including the receive filter 57. As a result, when the front-end circuit 500A according to the second comparative example receives radio-frequency receive signals in the TDD-only mode, the radio-frequency receive signals pass through the receive filters 54 and 57, and thus, the propagation loss cannot be reduced.

By contrast, with the configuration of the front-end circuit 1A according to the present preferred embodiment, when a radio-frequency signal is received in the TDD-only mode in a system capable of transferring radio-frequency signals while switching a plurality of communication systems such as TDD and FDD, the radio-frequency signal propagation loss can be reduced. Furthermore, when radio-frequency signals according to the TDD and FDD systems are simultaneously received in a CA operation involving the TDD and FDD systems used for different frequency range groups, radio-frequency signals can be transferred with high quality and reduced mutual interference.

The front-end circuit 1A according to the present preferred embodiment may include transmit circuits. In this case, transmit filters are provided in one-to-one correspondence with the respective receive filters 51R to 53R, 56R, and 58R, which are used for the FDD system.

The front-end circuit 1A according to the present preferred embodiment may switch signal paths for radio-frequency transmit signals to be output from the antenna 2 via the front-end circuit 1A, similarly to the front-end circuit 1 according to the first preferred embodiment. In this case, the receive filters define and function as transmit filters.

The front-end circuit 1A according to the present preferred embodiment may include a controller configured or programmed to control switching of the switching circuits 21, 23, 24, 41, 43, and 44. When a radio-frequency signal in one of Bands A4, C1, and D1 according to the TDD system is solely transferred or when radio-frequency signals in at least two of Bands A4, C1, and D1 according to the TDD system are synchronously transferred, the controller connects: (1) the common terminal 21a to the selection terminal 21f, and the common terminal 41a to the selection terminal 41f; (2) the common terminal 23a to the selection terminal 23*d*, and the common terminal 43*a* to the selection terminal 43*d*; and (3) the common terminal 24*a* to the selection terminal 24*d*, and the common terminal 44*a* to the selection terminal 44*d*, as appropriate.

When radio-frequency signals in at least two of Bands A4, C1, and D1 according to the TDD system are asynchronously transferred, the controller connects: (1) the common terminal 21*a* to the selection terminal 21*e*, and the common terminal 41*a* to the selection terminal 41*e*; (2) the common terminal 23*a* to the selection terminal 23*b*, and the common terminal 43*a* to the selection terminal 43*b*; and (3) the common terminal 24*a* to the selection terminal 24*b*, and the common terminal 44*a* to the selection terminal 44*b*, as appropriate.

In the case in which a radio-frequency signal in at least one of Bands A4, C1, and D1 according to the TDD system and radio-frequency signals in communication bands according to the FDD system are simultaneously transferred, the following switching operation is performed. For example, when a radio-frequency signal in Band C1 according to the TDD system, a radio-frequency signal in Band A1 according to the FDD system, a radio-frequency signal in Band B1 according to the FDD system, and a radio-frequency signal in Band D2 according to the FDD system are simultaneously transferred, the controller connects: (1) the common terminal 21*a* to the selection terminal 21*b*, and the common terminal 41*a* to the selection terminal 41*b*; (2) the common terminal 23*a* to the selection terminal 23*b*, and the common terminal 43*a* to the selection terminal 43*b*; and (3) the common terminal 24*a* to the selection terminal 24*c*, and the common terminal 44*a* to the selection terminal 44*c*.

As such, the controller included in the front-end circuit 1A controls switching of the switching circuits by receiving information about selection of the TDD/FDD communication systems. This configuration improves the performance of the front-end circuit 1A and shortens the communication line of control signal, which enables high speed switching.

The controller may be included not in the front-end circuit 1A but, for example, in the RFIC 4 or the BBIC 5. In this case, the communication device 6 includes the controller.

OTHER PREFERRED EMBODIMENTS

While the front-end circuits and the communication devices according to the first and second preferred embodiments have been described above, the front-end circuits and the communication devices of the present invention are not limited to the preferred embodiments. The present invention also includes other preferred embodiments including any combination of the elements of the preferred embodiments and modifications, other modified examples obtained by making various modifications that occur to those skilled in the art without departing from the scope of the preferred embodiments and modifications described above, and various hardware devices including the front-end circuits and the communication devices of preferred embodiments of the present invention.

The controllers according to preferred embodiments of the present invention may be an IC or large scale integration (LSI) circuit, for example. The integrated circuit may be a dedicated circuit or general processor, for example. It is possible to use a field-programmable gate array (FPGA) that is programmable after the LSI circuit is manufactured or a reconfigurable processor in which the connection or the setting of a circuit cell inside the LSI circuit can be reconfigurable after the LSI circuit is manufactured. Furthermore, if LSI is replaced with another technology of fabricating an integrated circuit developed due to progress of semiconductor technologies or other technologies derived from LSI, it is possible to use the technology for integrating functional blocks with each other.

In the front-end circuits and the communication devices according to preferred embodiments of the present invention, another radio-frequency circuit element or another wire may be inserted between the circuit elements or the paths connecting a signal path that are illustrated in the drawings.

Preferred embodiments of the present invention can be used, as a multiband/multimode switch module using carrier aggregation, for a wide range of communication devices such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A front-end circuit for communicating a radio-frequency signal, comprising:
   a first input-output terminal, a second input-output terminal, and a third input-output terminal to input a radio-frequency signal to the front-end circuit or output a radio-frequency signal from the front-end circuit;
   a first switching circuit including a first common terminal coupled to the first input-output terminal, the first switching circuit also including a first selection terminal and a second selection terminal, the first switching circuit being configured to exclusively connect the first common terminal to the first selection terminal or to the second selection terminal;
   a first filter configured to pass a radio-frequency signal in a first communication band;
   a first signal path connecting the first selection terminal and the second input-output terminal, the first filter being disposed in the first signal path, the first signal path being configured to communicate the radio-frequency signal in the first communication band;
   a second signal path connecting the second selection terminal and the third input-output terminal, the second signal path defining and functioning as a bypass path without any filter, the second signal path being configured to communicate the radio-frequency signal in the first communication band; and
   a controller configured or programmed to control switching of the first switching circuit; wherein
   the front-end circuit is configured to exclusively switch between communication of the radio-frequency signal in the first communication band from the first input-output terminal to the second input-output terminal through the first signal path and communication of the radio-frequency signal in the first communication band from the first input-output terminal to the third input-output terminal through the second signal path or between communication of the radio-frequency signal in the first communication band from the second input-output terminal to the first input-output terminal through the first signal path and communication of the radio-frequency signal in the first communication band from the third input-output terminal to the first input-output terminal through the second signal path; and
   the controller is configured or programmed to:
   when the radio-frequency signal in the first communication band according to a time division duplex system is solely communicated, connect the first common terminal and the second selection terminal; and when the radio-frequency signal in the first communication band according to the time division duplex system and a radio-frequency signal in a communication band other than the first communication band according to a frequency division duplex system are simultaneously communicated, connect the first common terminal and the first selection terminal.

2. The front-end circuit according to claim 1, further comprising:

a second switching circuit including a second common terminal, a third selection terminal, and a fourth selection terminal, the second switching circuit being configured to exclusively connect the second common terminal to the third selection terminal or to the fourth selection terminal; wherein the second input-output terminal is the third selection terminal;

the third input-output terminal is the fourth selection terminal;

the second common terminal is configured to output a radio-frequency signal from the front-end circuit or input a radio-frequency signal to the front-end circuit;

when the second common terminal is coupled to the third selection terminal, the first common terminal is coupled to the first selection terminal; and when the second common terminal is coupled to the fourth selection terminal, the first common terminal is coupled to the second selection terminal.

3. The front-end circuit according to claim 2, wherein the first switching circuit and the second switching circuit are collectively provided as a single chip.

4. The front-end circuit according to claim 1, wherein the first filter is used for the time division duplex system; and the first signal path and the second signal path are configured to communicate a radio-frequency signal according to the time division duplex system.

5. The front-end circuit according to claim 4, wherein the first switching circuit further includes a fifth selection terminal;

the front-end circuit further comprises:
 a fourth input-output terminal to input a radio-frequency signal to the front-end circuit or output a radio-frequency signal from the front-end circuit;
 a third filter configured to pass a radio-frequency signal in a second communication band and used for the frequency division duplex system; and
 a third signal path connecting the fifth selection terminal and the fourth input-output terminal;
wherein the third filter is disposed in the third signal path.

6. The front-end circuit according to claim 1, wherein the first filter is used for a supplemental downlink (SDL) system; and the first signal path and the second signal path are configured to communicate a radio-frequency signal according to the SDL system.

7. The front-end circuit according to claim 1, wherein the first communication band is Long Term Evolution (LTE) Band 32, Band 34, Band 39, Band 40, or Band 41.

8. The front-end circuit according to claim 1, wherein the first communication band is a Global Positioning System (GPS) (registered trademark) band or a Wi-Fi (registered trademark) band.

9. The front-end circuit according to claim 1, further comprising:

an amplifier circuit directly or indirectly coupled to the second input-output terminal and the third input-output terminal.

10. A communication device comprising:

a radio-frequency (RF) signal processing circuit configured to process a radio-frequency signal received by an antenna; and the front-end circuit according to claim 1;

the front-end circuit being configured to communicate the radio-frequency signal between the antenna and the RF signal processing circuit.

11. A front-end circuit for communicating a radio-frequency signal, comprising:

a first input-output terminal, a second input-output terminal, and a third input-output terminal to input a radio-frequency signal to the front-end circuit or output a radio-frequency signal from the front-end circuit;

a first switching circuit including a first common terminal, a first selection terminal, and a second selection terminal, the first switching circuit being configured to exclusively connect the first common terminal to the first selection terminal or to the second selection terminal;

a first filter configured to pass a radio-frequency signal in a first communication band;

a first signal path connecting the first selection terminal and the second input-output terminal, the first filter being disposed in the first signal path, the first signal path being configured to communicate the radio-frequency signal in the first communication band;

a second signal path connecting the second selection terminal and the third input-output terminal, the second signal path defining and functioning as a bypass path without any filter, the second signal path being configured to communicate the radio-frequency signal in the first communication band; and a second filter coupled between the first input-output terminal and the first common terminal, the second filter being configured to pass a first frequency range group including the first communication band.

12. The front-end circuit according to claim 11, further comprising:

a fifth input-output terminal, a sixth input-output terminal, and a seventh input-output terminal to input a radio-frequency signal to the front-end circuit or output a radio-frequency signal from the front-end circuit;

a third switching circuit including a third common terminal, a sixth selection terminal, a seventh selection terminal, and an eighth selection terminal, the third switching circuit being configured to exclusively connect the third common terminal to the sixth selection terminal, the seventh selection terminal, or the eighth selection terminal;

a fourth filter coupled between the first input-output terminal and the third common terminal;

a fifth filter configured to pass a radio-frequency signal in a third communication band;

a sixth filter configured to pass a radio-frequency signal in a fourth communication band and used for a frequency division duplex system;

a fourth signal path connecting the sixth selection terminal and the fifth input-output terminal;

a fifth signal path connecting the seventh selection terminal and the sixth input-output terminal; and a sixth signal path connecting the eighth selection terminal and the seventh input-output terminal; wherein the first filter is used for a time division duplex system, the first signal path and the second signal path are configured to communicate a radio-frequency signal according to the time division duplex system;

the fifth filter is disposed in the fourth signal path, the fifth signal path defines and functions as a bypass path without any filter; and the sixth filter is disposed in the sixth signal path.

13. The front-end circuit according to claim 12, further comprising:

a controller configured or programmed to control switching of the first switching circuit and switching of the third switching circuit; wherein the controller is configured or programmed to:

when the radio-frequency signal in the first communication band according to the time division duplex system and the radio-frequency signal in the third communication band according to the time division duplex system are synchronously communicated, connect the first common terminal and the second selection terminal and connect the third common terminal and the seventh selection terminal;

when the radio-frequency signal in the first communication band according to the time division duplex system and the radio-frequency signal in the third communication band according to the time division duplex system are asynchronously communicated, connect the first common terminal and the first selection terminal and connect the third common terminal and the sixth selection terminal; and when the radio-frequency signal in the first communication band according to the time division duplex system and the radio-frequency signal in the fourth communication band according to the frequency division duplex system are simultaneously communicated, connect the first common terminal and the first selection terminal and connect the third common terminal and the eighth selection terminal.

14. The front-end circuit according to claim 12, wherein the first communication band is included in one of a middle-low band from about 1475.9 MHz to about 2025 MHz, a middle band from about 2110 MHz to about 2200 MHz, a middle-high band from about 2300 MHz to about 2400 MHz, and a high band from about 2496 MHz to about 2690 MHz; and the third communication band and the fourth communication band are both included in one of the four different frequency range groups.

15. The front-end circuit according to claim 11, wherein the first filter and the second filter are surface acoustic wave filters, boundary acoustic wave filters, or bulk acoustic wave filters.

16. The front-end circuit according to claim 11, further comprising:

a second switching circuit including a second common terminal, a third selection terminal, and a fourth selection terminal, the second switching circuit being configured to exclusively connect the second common terminal to the third selection terminal or to the fourth selection terminal; wherein the second input-output terminal is the third selection terminal;

the third input-output terminal is the fourth selection terminal;

the second common terminal is configured to output a radio-frequency signal from the front-end circuit or input a radio-frequency signal to the front-end circuit;

when the second common terminal is coupled to the third selection terminal, the first common terminal is coupled to the first selection terminal; and when the second common terminal is coupled to the fourth selection terminal, the first common terminal is coupled to the second selection terminal.

17. The front-end circuit according to claim 16, wherein the first switching circuit and the second switching circuit are collectively provided as a single chip.

18. The front-end circuit according to claim 11, wherein the first filter is used for a time division duplex system; and the first signal path and the second signal path are configured to communicate a radio-frequency signal according to the time division duplex system.

19. The front-end circuit according to claim 11, wherein the first filter is used for a supplemental downlink (SDL) system; and the first signal path and the second signal path are configured to communicate a radio-frequency signal according to the SDL system.

\* \* \* \* \*